United States Patent [19]

Sawaguchi et al.

[11] Patent Number: 5,568,330
[45] Date of Patent: Oct. 22, 1996

[54] RECORDING/REPRODUCING APPARATUS WITH MAXIMUM LIKELIHOOD SEQUENCE ESTIMATION

[75] Inventors: Hideki Sawaguchi; Yasuhide Ouchi, both of Kodaira; Naoki Sato, Kokubunji; Yosuke Hori, Hiratsuka, all of Japan

[73] Assignee: Hitachi, Ltd., Tokyo, Japan

[21] Appl. No.: 312,803

[22] Filed: Sep. 27, 1994

Related U.S. Application Data

[62] Division of Ser. No. 10,390, Jan. 28, 1993, Pat. No. 5,392,316.

[30] Foreign Application Priority Data

Jan. 28, 1992 [JP] Japan .................................. 4-012818

[51] Int. Cl.$^6$ ............................................. G11B 5/09
[52] U.S. Cl. .............................................. 360/46; 360/51
[58] Field of Search .................................. 360/32, 46, 51, 360/40; 375/17, 18, 341

[56] References Cited

U.S. PATENT DOCUMENTS

| | | | |
|---|---|---|---|
| 4,571,734 | 2/1986 | Dolivo et al. | 375/18 |
| 4,644,564 | 2/1987 | Dolivo et al. | 375/18 |
| 5,166,955 | 11/1992 | Ohta | 375/18 |
| 5,265,125 | 11/1993 | Ohta | 375/18 |
| 5,270,876 | 12/1993 | Inoue et al. | 360/46 |
| 5,287,228 | 2/1994 | Sawaguchi et al. | 360/46 |
| 5,341,249 | 8/1994 | Abbott et al. | 360/46 |
| 5,357,378 | 10/1994 | Urakawa | 360/46 |

OTHER PUBLICATIONS

"Application of Probabilistic Decoding to Ddigital Magnetic Recording Systems", H. Kobayashi, IBM Journal of Research and Development, vol. 15, No. 1, Jan. 1971, pp. 64–74.

"Adaptive Maximum–Likelihood Receiver for Carrier–Modulated Data–Transmission Systems", Ungerboeck, IEEE Transactions of Communications, vol. Com–22, No. 5, May 1974, pp. 624–636.

"The Viterbi Algorithm", Forney Jr., Proceedings of the IEEE, vol. 61, No. 3, Mar. 1973, pp. 268–278.

*Primary Examiner*—W. Chris Kim
*Attorney, Agent, or Firm*—Antonelli, Terry, Stout & Kraus

[57] ABSTRACT

A magnetic recording apparatus comprises: a magnetic recording medium for recording a binary signal; a magnetic head for detecting the binary signal; an amplifier for amplifying the binary signal detected by the magnetic head; a channel for outputting the amplifier binary signal in the form of a timing value sequence, the timing value sequence alternately providing positive and negative peak values following the rule of the binary signal a recorded in the recording medium; a temporary judging unit for judging a presently input timing value of the timing value sequence supplied from the channel as one of the positive peak value, the negative peak value, and an intermediate value, in accordance with the relationship with a preceding timing value temporarily judged as one of the positive and negative peak values; a final judging unit for finally setting the preceding timing value as one of the positive and negative peak values and the intermediate value, in accordance with the relationship with the presently input and temporarily judged timing value; a counter for counting the number of input bits of the timing value sequence; a unit for resetting the counter when the timing value temporarily judged as one of the positive and negative peak values is output; a register for storing a decoded binary bit value; and a unit for overwriting the bit value in the register at the bit position corresponding to the count of the counter.

20 Claims, 11 Drawing Sheets

FIG. 3A1
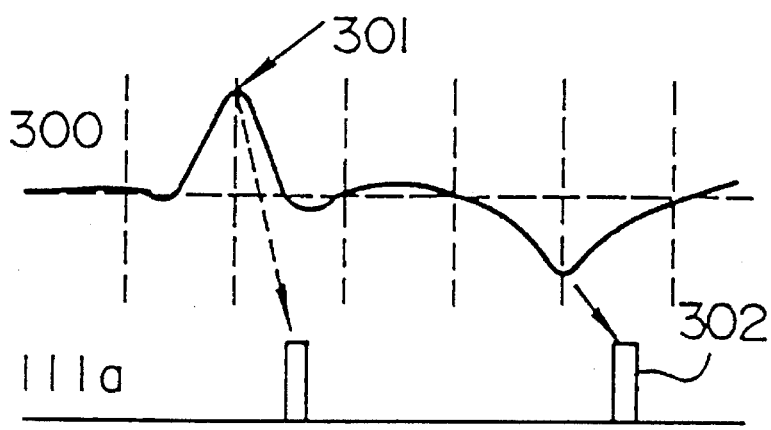
FIG. 3A2
FIG. 3A3
FIG. 3A4
FIG. 3A5
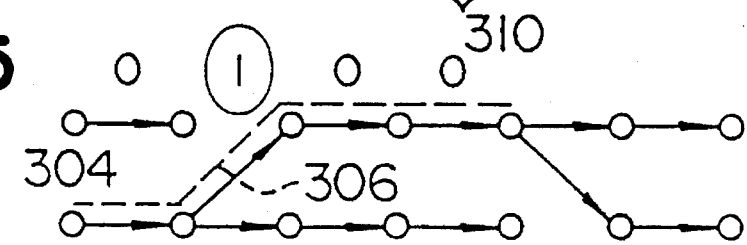

FIG. 3B1 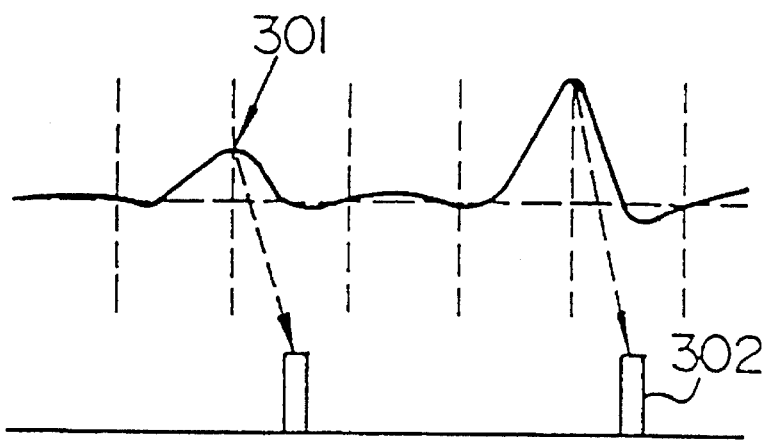
FIG. 3B2 
FIG. 3B3 
FIG. 3B4 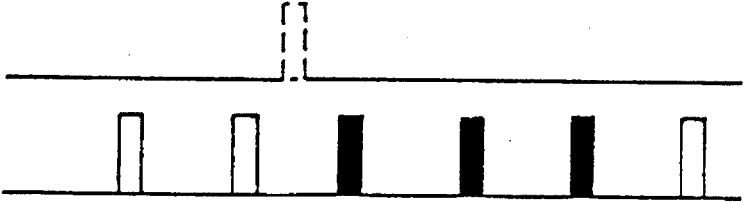
FIG. 3B5 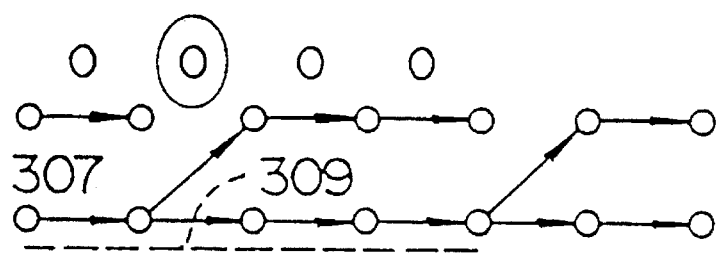

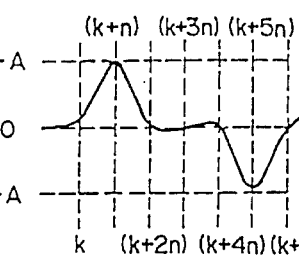
FIG. 9B
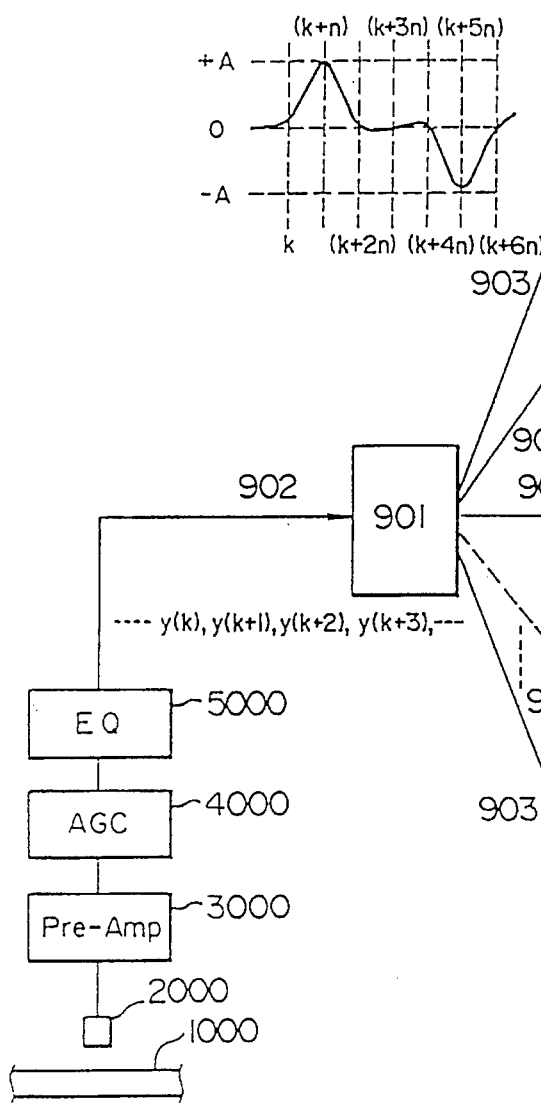
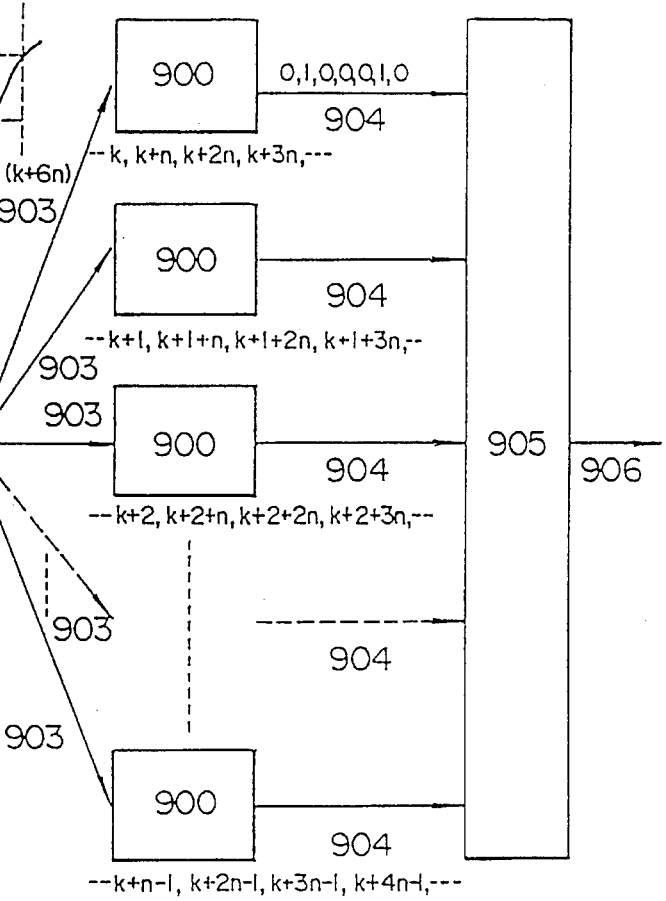
FIG. 9A

RECORDING/REPRODUCING APPARATUS WITH MAXIMUM LIKELIHOOD SEQUENCE ESTIMATION

This application is a 37 CFR §1.60 divisional of prior application Ser. No. 08/010,390, filed Jan. 28, 1993 U.S. Pat. No. 5,392,316.

BACKGROUND OF THE INVENTION

1. Field of the Invention

The present invention relates to a method and apparatus for decoding an encoded signal received from a channel into a binary code sequence {a(n)}. More particularly, the invention relates to a decoding system for decoding an encoded signal into a binary code sequence by using maximum likelihood sequence estimation (MLSE), the encoded signal being received from a communications channel or a recording/reproducing channel of a recorder belonging to a Partial Response (PR) Class in which intersymbol interference can be described by a polynomial 1−D(n) or 1+D(1) where D(n) is a code preceded by n codes.

2. Description of the Related Art

A PR system can process intersymbol interference in an improved manner, and can efficiently use the bandwidth allocated to a channel. With the PR system, a receiver decodes an input signal while taking into account identified intersymbol interference. Communications in a PR system allows data transfer at a Nyquist rate, and provides a proper tradeoff between decoding error probability and usable received signal spectra. PR classes with the impulse response characteristics described with polynomials 1+D(1) and 1−D(n) are called Classes I (duo-binary) and IV, respectively.

Maximum Likelihood Sequence Estimation (MLSE), particularly a Viterbi algorithm, is an efficient means for improving the decoding quality of a receiver where intersymbol interference is present. As papers regarding MLSE and Viterbi algorithm, there are known "The Viterbi Algorithm", by G. D. Forney, Proceedings of the IEEE, Vol. 61, No. 3, March 1973, pp. 268 to 278, and "Adaptive Maximum-likelihood Receiver for Carrier-modulated Data Transmission Systems", by G. Ungerboeck, IEEE Transactions on Communications", Vol. COM-22, No. 5, May 1974, pp. 624 to 638. These papers describe an MLSE receiver and part of its fundamentals.

Use of MLSE or Viterbi algorithm with a PR system is suggested in a paper "Application of Probabilistic Decoding to Digital Magnetic Recording Systems", by H. Kobayashi, IBM Journal of Research and Development, Vol. 15, No. 1, January 1971, pp. 64 to 74. In MLSE, given a received bit sequence {Z(n)} where n is an integer representing the discontinuous occurrence order of each bit in the received bit sequence, the maximum likelihood sequence is selected from all possible transmitted bit sequences {X(n)}. Namely, the sequence {X(n)} having the maximum probability P[{Z(n)}/{X(n)}] of receiving the sequence {Z(n)} is selected. In this case, the bit sequence {X(n)} is not selected independently, but selected while taking into account the sequential relationship between bits before and after the bit in concern. MLSE can be efficiently executed by using dynamic programming of a Viterbi algorithm which uses a set of reservoir sequences of a selected bit sequence {X(n)} and a metric of each reservoir sequence representing the maximum likelihood. One of the characteristics of a metric is a possibility that the absolute value of the metric becomes infinite.

In the disclosure of JP-A-60-47538, only two reservoir sequences are used for a Partial Response signal sequence, and only differences between sets of two metrics of the two sequences are calculated and stored to thereby decode a binary code sequence discontinuous in time correctly and at high speed by using a simplified circuit. As compared with a conventional process which obtains one metric difference using two metrics for two paths, this conventional technique requires less computation and storage capacity thus, simplifying the structure and improving the efficiency. Furthermore, a metric difference will not become infinite as opposed to the metric for each path, and the decoding reliability is assured by using MLSE for the selection of a final decoded sequence. According to the present invention, there is provided means for realizing a simple and high speed operation through interleaving and pipelining for the case of Partial Response Class IV. Specifically, a limiter circuit provides an easy calculation of a metric difference and reservoir sequence.

SUMMARY OF THE INVENTION

It is a first object of the present invention to provide a decoding method and apparatus for decoding an encoded binary code sequence {a(n)} supplied from a Partial Response channel into a maximum likelihood code sequence at a minimum delay time and with simplified circuitry.

Decoding through maximum likelihood sequence estimation provides a high decoding reliability for signals having intermittent signal defects such as random noises. However, the operation of decoding becomes very unstable for signals having burst noises or continuously lowered signal level, and in addition, a decoding error propagates to normal signals before and after the erroneously decoded bit, considerably degrading the reliability.

It is therefore a second object of the present invention to provide a decoding method and apparatus capable of dealing with an abnormal state such as lowered signal level without deteriorating the performance of the decoder, and starting the decoding operation quickly after the recovery of a normal state of an incoming signal. With such a decoding method and apparatus, it becomes possible to make the decoder responsive to the normal state quickly and use it effectively and efficiently, in decoding an incoming signal sequence with possible disturbances from a communications channel or recording/reproducing through maximum likelihood sequence estimation.

In the decoder using maximum likelihood sequence estimation, a storage unit for storing reservoir sequences which are candidates to be selected as the maximum likelihood sequence, occupies a large portion of circuitry. According to the present invention, storing reservoir sequences is managed efficiently to provide the decoding method and apparatus capable of minimizing the circuit scale and providing a simple and high speed operation. In the maximum likelihood sequence estimation, each time a bit in an encoded bit sequence is received, a pair of new reservoir sequences and new metric difference are calculated. Thereafter, the bit in concern is temporarily judged or estimated, and the temporarily judged preceding bit is finally settled. Therefore, bits before the finally settled bit have already had the finally settled decoded results which do not need to be maintained further in the decoder.

One of the binary codes may be assigned as the temporarily judged bit, and this bit is corrected to obtain the final decoded result when the final settlement is to be made. The above-described two approaches are used in the present invention to simplify the memory management for reservoir sequences. An incoming bit sequence having a run length limit may be used for setting a finite time as the delay time from the temporary estimation to the final estimation.

Use of the incoming bit sequence having a run length limit allows for detection of an abnormal state such as continuously lowered signal level, by checking the delay time from the temporary estimation to the final estimation. The abnormal state such as a continuously lowered signal level can be reliably detected, because the maximum likelihood sequence estimation performs the decoding operation while observing signals from the view point of sequential relationship. When an abnormal state is detected with such a reliability and basing upon the run length limit, decoding through the maximum likelihood sequence estimation is stopped at once and the decoder is initialized and stands by until the normal state is recovered.

The normal state of an incoming bit sequence is detected by changing a slice level as opposed to a conventional technique using a fixed slice level. One of the binary codes having a higher occurrence probability is assigned as the temporarily estimated bit during the abnormal state, and an alarm signal indicating an occurrence of a decoded error is issued, thereby obtaining the highest decoding reliability for bits during both the abnormal state and recovered normal state.

If one of the binary codes is assigned as the temporarily estimated bit and this bit is corrected to obtain the final decoded result when the final estimation is to be performed, then it is sufficient to store only one reservoir sequence. The correction of this temporarily estimated bit is readily performed by using a circuit for managing the address of the temporarily estimated bit and a circuit for overwriting the bit.

Bits before the finally settled bit have already had the final decoded results and it is no longer necessary to maintain them in the decoder. Therefore, by using an incoming bit sequence with the bit run length limit, it is possible to set the maximum delay time from the temporary estimation to the final estimation to a finite time, defining the bit length of a storage unit for storing reservoir sequences. Furthermore, the capacity of the circuit for storing the address of the temporarily estimated bit can be minimized.

Furthermore, upon detection of an abnormal state by positively using the limited delay time resulting from the run length limited code, the operation of the decoder is stopped to suspend the maximum likelihood sequence estimation which uses signals under the abnormal state with lower decoding reliability. It is therefore possible to prevent a decoding error from propagating to signals under the normal state. In this way, not only can the decoding reliability be prevented from being degraded, but also the capacity of the circuit for storing the address of the temporarily estimated bit can be reduced to a definite amount.

The contents of the decoder are initialized and the decoding operation starts upon the recovery of the normal state. This initialization discards the maximum likelihood sequence and its metric (likelihood) information of low reliability obtained during the abnormal state. Therefore, the decoder can reliably and quickly follow signals under the recovered normal state, maximizing the final or total decoding reliability.

According to one aspect of the present invention, there is provided a method of decoding an output signal from a channel having the characteristic of one of Partial Response Classes I and IV, comprising the steps of: identifying which one of three-value levels is most likely to match a bit of a timing value sequence of an analog output signal formed from a binary code sequence and supplied from the channel, by using a maximum likelihood sequence estimation algorithm; generating a temporarily judged signal for a presently detected timing value if the presently detected timing value is most likely to have one of the maximum and minimum levels of the three-value levels; generating a finally judged signal for a preceding timing value already given the temporarily judged signal if the preceding timing value is judged, from the timing value sequence up to the presently detected timing value, as having one of the maximum and minimum levels; bit-shifting the contents of a shift register storing a decoded binary bit sequence, synchronously with an input of each bit of the timing value sequence; counting the number of bits of the timing value sequence received during the period from when outputting the temporarily judged signal to when outputting the finally judged signal; and changing the content of the shift register at the bit position corresponding to the count, in response to an output of the finally judged signal.

As the binary code sequence, a binary code sequence having a run length limit of the maximum bit length k is used, and the shift register which stores a decoded binary bit sequence having information of (k+1) bits or more is used. It is therefore possible to effectively use the storage unit.

There are used the binary code sequence having a run length limit of the maximum bit length k, and the shift register which stores a decoded binary bit sequence having information of (k+n) bits or more where n is a natural number 1 or greater. A coincidence signal is generated when the count of bits of the timing value sequence coincides with a predetermined value of (k+n) bits or more, and in response to the coincidence signal, the content of the shift register at the position corresponding to the count is changed. It is therefore possible to prevent a decoding error from propagating to other bits.

There is further used a state register for storing a normal/abnormal state of the timing value sequence. An abnormal state is stored in the state register in response to an output of the coincidence signal, and a normal state is stored in the state register in response to an output of the temporarily judged signal. During the period while the state register indicates the abnormal state, it is possible to stop counting the bits of the timing value sequence or to inhibit change of the content of the shift register at the bit position corresponding to the count of bits of the timing value sequence. It is therefore possible to prevent the abnormal state of the input timing value sequence from adversely affecting decoded results.

It is preferable to initialize a counter for counting the number of bits of the timing value sequence, in response to an output of the coincidence signal. The state recorded in the state register may be output when a decoded result is output.

It is also preferable to stop, in response to the coincidence signal or while the content of the state register indicates the abnormal state, the operation of decoding the input timing value sequence through the maximum likelihood sequence estimation algorithm, and to detect the succeeding bit having one of the maximum and minimum levels by comparing each bit of the timing value sequence with a fixed comparison level.

The coincidence signal may be output by forcibly applying a signal externally from the decoder.

According to another aspect of the present invention, there is provided an apparatus for decoding a sequence most likely to match the original sequence from a dispersed timing value sequence of an analog output signal formed from a binary code sequence and supplied from one of a communications channel and recording/reproducing channel having the characteristic of one of Partial Response Classes I and IV, comprising: means for identifying which one of three-value levels is most likely to match a bit of the dispersed timing value sequence supplied from the channel, by using a maximum likelihood sequence estimation algorithm; means for generating a temporarily judged signal for a presently detected timing value if the presently detected timing value is most likely to have one of the maximum and minimum levels of the three-value levels; means generating a finally judged signal for a preceding timing value already given the temporarily judged signal if the preceding timing value is judged, from the timing value sequence up to the presently detected timing value, as having one of the maximum and minimum levels; a shift register for storing a decoded binary bit sequence and bit-shifting the contents synchronously with an input of each bit of the timing value sequence; a counter for counting the number of bits of the timing value sequence received during the period from when outputting the temporarily judged signal to when outputting the finally judged signal; and means for changing the content of the shift register at the bit position corresponding to the count, in response to an output of the finally judged signal.

According to a further aspect of the present invention, there is provided a magnetic recording apparatus comprising: a magnetic recording medium for recording a binary signal; a magnetic head for detecting the binary signal from the magnetic recording medium; an amplifier for amplifying the binary signal detected by the magnetic head; a channel for outputting the detected binary signal amplified by the amplifier in the form of a timing value sequence, the timing value sequence alternately providing positive and negative peak values following the rule of the binary signal recorded in the recording medium; temporary judging means for judging a presently input timing value of the timing value sequence supplied from the channel as one of the positive peak value, the negative peak value, and an intermediate value, in accordance with the relationship with a preceding timing value temporarily judged as one of the positive and negative peak values; and final judging means for finally setting the preceding timing value temporarily judged as one of the positive and negative peak values, as one of the positive and negative peak values and the intermediate value, in accordance with the relationship with the presently input and temporarily judged timing value.

The binary signal from the amplifier is distributed by a multiplexer to a plurality of channels in the form of a timing value sequence alternately providing positive and negative peak values.

The temporary judging means temporarily judges the presently input timing value of the timing value sequence as one of the positive peak value, the negative peak value, and the intermediate value, in accordance with the relationship with the amplitude of a preceding timing value temporarily judged as being one of the positive and negative peak values. For example, the temporary judging means may be constituted by an input latch for latching the presently input timing value, a peak hold circuit for holding the preceding timing value temporarily judged as one of the positive and negative peak values, and comparator means for comparing an output of the input latch with an output of the peak hold circuit. The comparator means may comprise a first subtracter for subtracting an output of the peak hold circuit from an output of the input latch, and a second subtracter for subtracting a predetermined value from an output of the first subtracter.

The final judging means judges the preceding timing value temporarily judged as one of the positive and negative peak values, as one of the positive and negative peak values and the intermediate value, in accordance with the relationship with the polarity of the presently input and temporarily judged timing value. The final judging means finally determines the preceding timing value temporarily judged as one of the positive and negative peak values, in accordance with the following rules:

(1) determining it to be the positive peak value if the preceding timing value temporarily judged is the positive peak value and the presently input and temporarily judged timing value is the negative peak value;

(2) determining it to be the negative peak value if the preceding timing value temporarily judged is the negative peak value and the presently input and temporarily judged timing value is the positive peak value; and (3) determining it to be the intermediate value if the preceding timing value temporarily judged has the same polarity as that of the presently input and temporarily judged timing value.

The final judging means may be constituted by a polarity hold circuit for holding the polarity of the preceding timing value temporarily judged as one of the positive and negative peak values, and a peak polarity judging circuit for judging whether there is a change in the polarity of the preceding timing value temporarily judged to be one of the positive and negative peak values. The final judging means may also comprise a counter for counting the number of input bits of the timing value sequence, means for resetting the counter when the timing value temporarily judged as one of the positive and negative peak values is outputted, a register for storing a decoded binary bit value, and means for overwriting the bit value in the register at the bit position corresponding to the count of the counter.

BRIEF DESCRIPTION OF THE DRAWINGS

FIGS. 3A1–3A5 and 3B1–3B5 conceptually illustrate examples of the decoding operation to be executed by the method and apparatus according to the present invention;

FIG. 5 conceptually illustrates an example of an error in the decoding operation executed by the embodiment shown in FIG. 1;

FIG. 9 is a block diagram showing a decoding system according to an embodiment of the present invention.

DESCRIPTION OF THE PREFERRED EMBODIMENTS (1st Embodiment)

Figure 1:
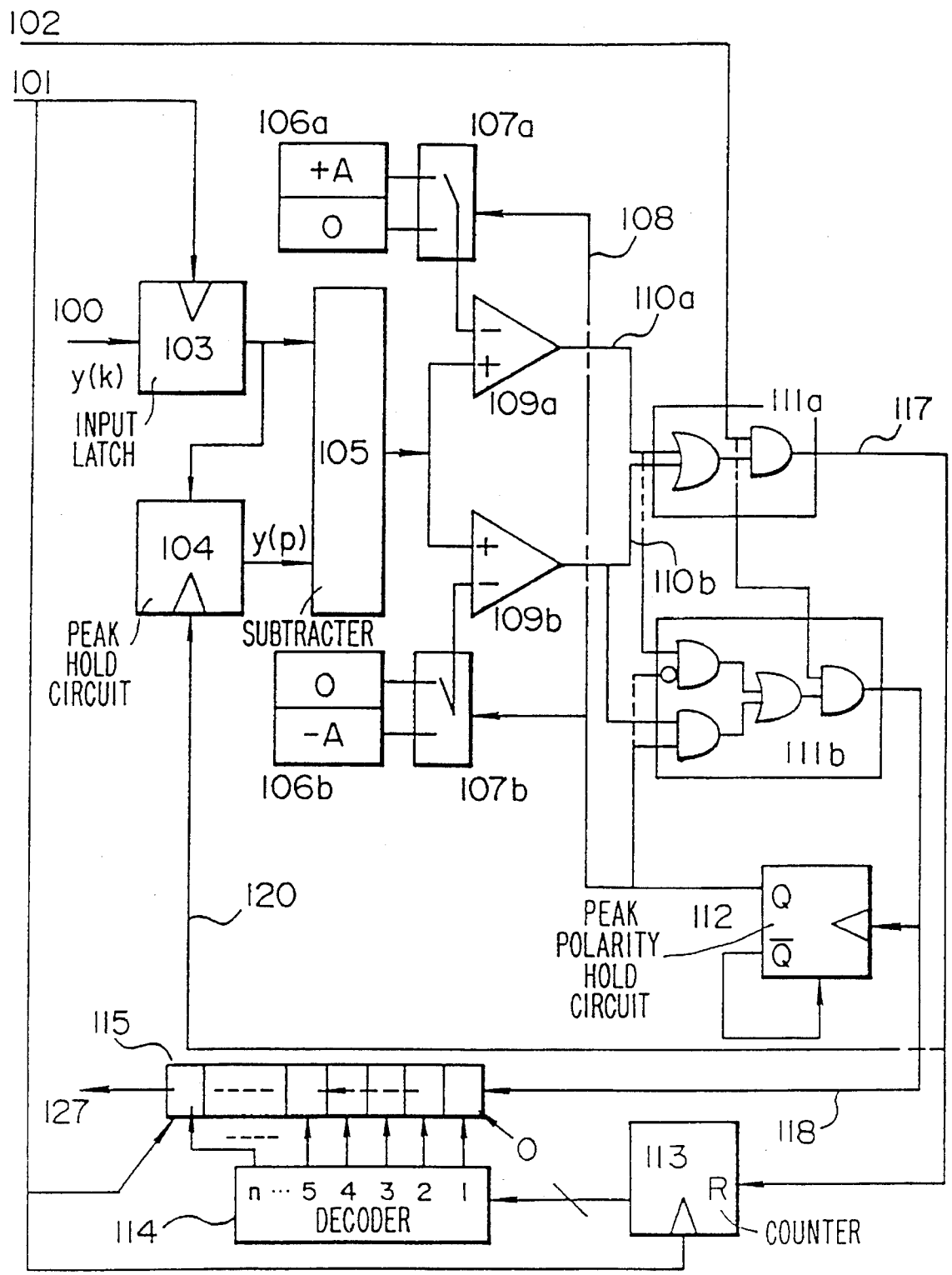
FIG. 1 is a block diagram showing an embodiment of the present invention.

FIG. 1 is a block diagram showing the fundamental structure of a decoder according to an embodiment of the present invention. The function of the embodiment decoder is to receive sampled analog signal values representing a binary code sequence discontinuous with time and supplied via a transmission channel or a recorder, to decode the analog signal values into a binary code sequence through maximum likelihood sequence estimation using a Viterbi algorithm, and to output the decoded binary code sequence.

Referring to FIG. 9, the overall structure of a decoding system of the present invention will be described. Consider now a communications channel or recording/reproducing channel of a recorder, having a data transfer characteristic of Partial Response Class IV described with a polynomial 1−D(n) where D(n) is a channel input code preceded by n codes. Using such a channel, a sampled value of a channel output signal takes three values {+A, 0, −A} where A is an absolute value of the sampled value, for the ideal case with perfect synchronization between transmitted and received bit or symbol sequences.

In addition, with the 1−D(n) data transfer characteristic channel, +A and −A signal values appear alternately in an output signal sampled value sequence {. . . y(k−n), y(k), y(k+n), y(k+2n) . . . } sequentially sampled every (n−1) codes from a channel output signal sampled value y(k) where k is an integer representing a sampling timing and the order of sampling timings. In this embodiment, all sampled values 900 y(k) of a signal output from the 1−D(n) data transfer characteristic channel are multiplexed by a multiplexer 901 to sequentially and regularly distribute one sampled value after another to n output rows. In this way, all of the output signal sampled values y(k) are extracted every (n−1) codes, to separate them into sampled signal value sequences 903 of n rows in an interleaved manner. Each signal sampled value sequence 903 is input to a corresponding one of n parallel decoders 900 embodying the present invention.

Each decoder 900 checks the levels of an input signal sampled value sequence by means of maximum likelihood sequence estimation. Assuming that a signal sampled value sequence is supplied from an ideal 1−D(n) data transfer characteristic channel, each decoder 900 obtains the maximum likelihood sequence directly from the detected code train having a value "1" at the timing when the sampled value +A or −A is detected and a value "0" at the timing when the sampled value 0 is detected. This is similar to the function of a conventional decoder which assigns a value "1" to a sampled value equal to or larger than a predetermined level, and a value "0" to a sampled value smaller than the predetermined level. According to the present invention, the decoder 900 estimates the maximum likelihood sequence from the sequential relationship between input signal sampled values 903. Specifically, the invention positively uses the regularity that sampled values +A and −A alternately occur in a 1−D(n) data transfer characteristic channel, in order to improve the performance of detecting the maximum likelihood sequence while enhancing a likelihood difference between two reservoir sequences in each recorder.

Such an operation to be realized by using a Viterbi algorithm is disclosed in JP-A-60-47538. The detected bit sequences (decoded sequences 904 output from the decoders 900) are assembled by an assembler 905 and output as a decoded sequence 906 corresponding in order to the original sampled value sequence.

FIG. 9 shows an embodiment in which the invention is applied to a magnetic recording apparatus. A signal is read from a recording medium 1000 by a magnetic head 2000, and amplified by a pre-amplifier 3000. The gain of the signal is maintained constant by an automatic gain control amplifier (AGC) 4000, and the waveform of the signal is shaped if necessary by an equalizer 5000 or the like. An output signal of the equalizer 5000 is subjected to decoding.

A method of decoding an input sequence will be briefly described with reference to FIG. 2. A state transition diagram 202 is used which shows reservoir sequences for the input signal sampled value sequence y(k) 201 shown in FIG. 2, when using maximum likelihood sequence estimation. In the state transition diagram 202, a state +A indicates that the input signal sampled value sequence y(k) provides a positive pulse signal (+A). Similarly, a state −A indicates that the input signal sampled value sequence y(k) provides a negative pulse signal (−A). By using such a state transition diagram 201 of two states, it is possible to express all combinations of bits of the input signal sampled value sequence y(k) to be obtained from a communications channel or recording/reproducing channel of a recorder having an ideal 1−D(n) data transfer characteristic without noises or disturbances.

The maximum likelihood sequence estimation judges which one of all combinations of bits of an input signal sampled value sequence y(k) to be expressed on the state transition diagram 202 is most likely to represent the actual input signal sampled value train y(k) with possible noises and disturbances, and determines a final time course indicated by one line on the state transition diagram 202. This final time course indicates the maximum likelihood sequence 203 for the observed signal sampled value sequence y(k) originally supplied from the communications channel or recording/reproducing channel of a recorder. Use of this maximum likelihood sequence realizes the data decoding with the minimum error rate.

Figure 2A:
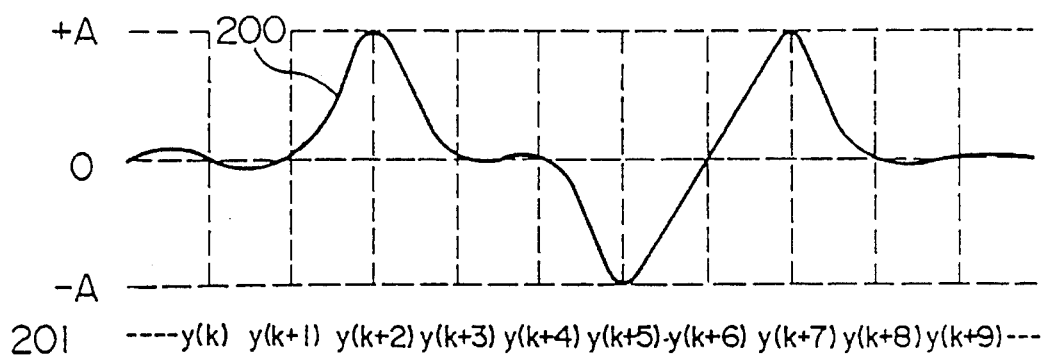
FIG. 2 conceptually illustrates the principle of a method of decoding a received bit sequence.
Figure 2B:
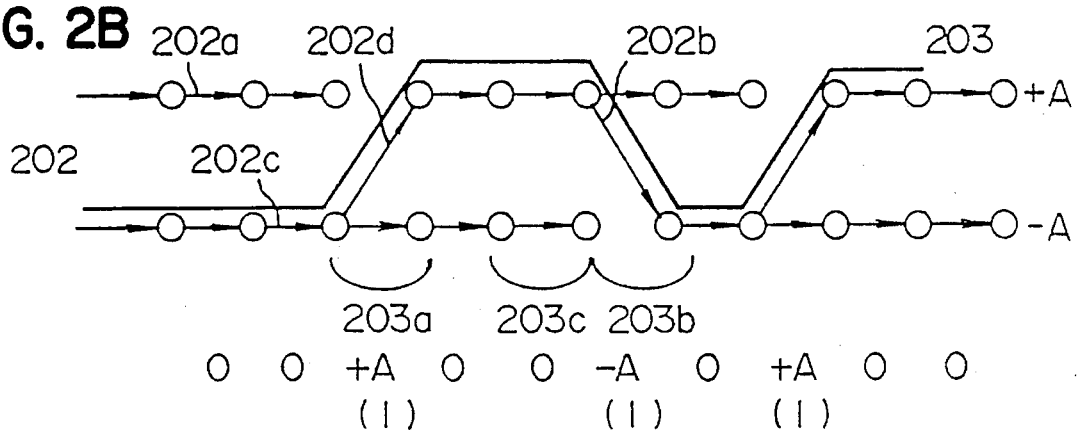

The way the state transition from one sampled value to another occurs on the state transition diagram 202, includes four of transitions as illustrated in FIG. 2. A transition (branch 202a) from state +A to +A indicates that the polarity (positive in this case) of the preceding pulse signal value does not change, and that no pulse signal is detected, i.e., the signal sampled value y(k) input to the decoder at the transition occurrence timing k is "0" when considering the regularity of the 1−D(n) data transfer characteristic that the positive polarity of the preceding pulse signal should be followed by the negative polarity of the next pulse signal.

A transition (branch 202b) from state +A to −A indicates that the signal sampled value y(k) is −A.

Similarly, a transition (branch 202c) from state −A to −A indicates that the polarity (negative in this case) of the preceding pulse signal value does not change, and that no pulse signal is detected, i.e., the signal sampled value y(k) input to the decoder at the transition occurrence timing k is "0" when considering the regularity of the 1−D(n) data transfer characteristic that the negative polarity of the preceding pulse signal should be followed by the positive polarity of the next pulse signal.

A transition (branch 202d) from state −A to +A indicates that the signal sampled value y(k) is +A.

One of the four state transitions is determined for the input value sampled at each timing, to obtain the decoded value.

The maximum likelihood sequence is expressed by a series of contiguous branches, each solely selected for each state transition in order that a summation of square errors, between the signal sampled value y(k) at each timing and the ideal value to be assigned to the corresponding branch, is minimized. The Viterbi algorithm uses dynamic programming to provide an efficient means for selecting branches satisfying such a condition. To this end, it is necessary to prepare a device for storing two reservoir sequences representing a transition between two states at each timing, and a device for storing two sets of summations of square errors (metrics) sequentially calculated for the two reservoir sequences. The above-cited JP-A-60-47538 reduces the calculation amount by calculating not two metrics themselves but differences between metrics, and provides a means for storing infinitely increasing two metrics as a finite and single metric in the form of metric differences.

FIG. 2 shows an example of the transition of the maximum likelihood sequence on the state transition diagram 202, for an input signal sampled value sequence y(k) 201 having, for example, a signal waveform 200 as shown.

Patterns to be obtained as state transitions relative to two states are classified into the following three patterns as indicated at 203a, 203b, and 203c. The state transition pattern 203a illustrates a temporary estimation indicating a possibility that the input signal sampled value at that timing is a positive pulse (+A). Similarly, the state transition pattern 203b illustrates a temporary estimation indicating a possibility that the input signal sampled value at that timing is a negative pulse (−A).

The state transition pattern 203c illustrates that the input signal sampled value at that timing is "0". If this state transition pattern 203c is obtained, it is possible to determine the decoded bit "0" for the input signal sampled value at that timing.

If, immediately after the state transition 203a or after the state transition 203c occurring one or more times following the state transition 203a, the state transition 203b opposite to the state transition 203a occurs, then the temporary estimation for the preceding state transition 203a is settled as a branch from the state −A to +A. Therefore, the positive polarity pulse (+A) and hence bit "1" is established for the input signal sampled value at that timing (first step of sequence estimation). Conversely, if the same state transition 203a occurs following the preceding state transition 203a, then the temporary estimation for the preceding state transition is settled as a branch from the state −A to +A, establishing bit "0" for the input signal sampled value. Similarly, if, immediately after the state transition 203b or after the state transition 203c occurring one or more times following the state transition 203b, the state transition 203a opposite to the state transition 203b occurs, then the temporary estimation for the preceding state transition 203b is settled as a branch from the state +A to −A. Therefore, the negative polarity pulse (−A) and hence bit "1" is established for the input signal sampled value at that timing (second step of sequence estimation). Conversely, if the same state transition 203b occurs following the preceding state transition 203b, then the temporary estimation for the preceding state transition is settled as a branch from the state −A to −A, establishing the bit "0" for the input signal sampled value. In this manner, each bit for the input signal sampled value y(k) at each timing k is determined by using the first and second steps of the sequence estimation. Which one of the three state transition patterns 203a, 203b, and 203c is allocated to the input signal sampled value y(k), can be judged from the following conditions:

$$y(k)-y(p) > THU \ldots \text{for } 203a \quad (1)$$

$$THL < y(k)-y(p) \leq THU \ldots \text{for } 203c \quad (2)$$

$$y(k)-y(p) \leq THL \ldots \text{for } 203b \quad (3)$$

where y(p) is an input sampled value for the preceding state transition 203a or 203b, THU is an upper threshold limit level, and THL is a lower threshold limit level. These threshold limit levels are set as follows.

For occurrence of preceding state transition 203a, $$THU=0 \quad (4),$$

for occurrence of preceding state transition 203b, $$THU=+A \quad (5),$$

for occurrence of preceding state transition 203a, $$THL=-A \quad (6),$$

and for occurrence of preceding state transition 203b, $$THL=0 \quad (7).$$

The algorithm for checking the state transition in the above-described manner is perfectly equivalent to the maximum likelihood estimation using the Viterbi algorithm.

According to the present invention, means for realizing an efficient and high speed decoding method with less hardware resources is provided first. In the fundamental embodiment shown in FIG. 1, an input signal 100 is held in an input latch 103. The value of the latched signal is subtracted by a value held in a peak hold circuit 104 by a subtracter 105.

This circuit arrangement corresponds to the function of executing a calculation y(k)−y(p) for the above conditions (1) to (3). Specifically, the input latch 103 sequentially latches an incoming input signal y(k) synchronously with an input signal sampling timing clock 101 (timing of the input signal input to the decoder). The peak hold circuit 104 holds the preceding input signal y(p) (signal temporarily judged as a peak signal) satisfying one of the conditions (1) to (3). The subtraction result is supplied to both comparators 109a and 109b at the same time. The comparator 109a checks the condition (1), and the comparator 109b checks the condition (3). Two upper threshold limit values THU are stored in a threshold value register 106a, and two lower threshold limit values THL are stored in another threshold value register 106b. One of the two values (+A and 0) in the threshold value register 106a is selected by a register selector 107a, and supplied to the other input terminal of the comparator 109a. The register selector 107a selects one of the two values in accordance with the conditions (4) and (5) which are dependent on whether the preceding state transition is 203a for the condition (1) or 203b for the condition (3). This information is stored in a peak polarity hold circuit 112. Referring to the information held in this circuit 112, the register selector 107a selects one of the values defined in the conditions (4) and (5), in response to a select signal 108. Similarly, one of the two values (0 and −A) in the threshold value register 106b is selected by a register selector 107b, and supplied to the other input terminal of the comparator 109b. The register selector 107b selects one of the two values in accordance with the conditions (6) and (7) which are dependent on whether the preceding state transition is 203a for the condition (1) or 203b for the condition (3). This information is stored also in the peak polarity hold circuit 112. Referring to the information held in this circuit 112, the register selector 107b selects one of the values defined in the conditions (6) and (7), in response to the select signal 108. With the circuit arrangement described above, the calculation and comparison operations for the conditions (1) to (3) can be realized. If the condition (1) is satisfied for an input signal sampled value y(k), a peak signal 110a output from the comparator 109a takes an on-state, so that the value y(k) is temporarily judged as a positive polarity peak. If the condition (3) is satisfied for an input signal sampled value y(k), a peak signal 110b output from the comparator 109b takes an on-state, so that the value y(k) is temporarily judged as a negative polarity peak. If the condition (2) is satisfied, both the output peak signals 110a and 110b take an off-state.

According to the decoding algorithm of the present embodiment, when the condition (1) or (3) is satisfied, the input signal sampled value y(k) is temporarily judged as a positive or negative polarity peak, and this peak value is stored in the peak hold circuit 104. A peak hold signal generator 111a is a logical circuit for generating a hold signal 120 in response to which the peak hold circuit 104 holds the input signal y(k). The peak hold signal generator 111a passes a sub-clock 102 therethrough when the peak signal 110a or 110b takes the on-state, and intercepts it when both the peak signals 110a and 110b take the off-state. This sub-clock is supplied as the hold signal 120 to the peak hold circuit 104. The sub-clock 102 has the same period as and a different phase from the clock signal 101. While the signal y(k) is latched by the input latch 103, i.e., during one clock 101, the calculation and comparison operations for the signal y(k) are completed and the signal y(k) is held as the signal y(p) in the peak hold circuit 104 in response to the hold signal 120 supplied from the peak hold signal generator 111a.

The peak polarity hold circuit 112 changes its output Q between an on-state and an off-state depending upon which one of the two conditions (1) and (3) was assigned to the signal y(p) held in the peak hold circuit 104, i.e, depending upon whether the temporary estimation is a positive or negative polarity peak. A peak polarity judgement circuit 111b judges whether the condition represented by the on-state peak signal 110a or 110b is different from the condition represented by the Q output of the peak polarity hold circuit 112. Specifically, if the peak signal 110b takes the on-state while the output Q of the peak polarity hold circuit 112 indicates the condition (1), or if the peak signal 110a takes the on-state while the output Q indicates the condition (3), the peak polarity judgement circuit 111b passes the sub-clock 102 therethrough, and otherwise intercepts it. An output of the peak polarity judgement circuit 111b triggers the peak polarity hold circuit 112 to invert its output Q. In the manner described above, the on- or off-state of the output Q of the peak polarity hold circuit 112 indicates which one of the peak signals 110a and 110b last turned on, i.e., which one of the conditions (1) and (3) was satisfied for the signal y(p) stored in the peak hold circuit 104. An output of the peak polarity hold circuit 112 is used as the select signal 108 to be supplied to the register selectors 107a and 107b which select the values stored in the threshold value registers 106a and 106b. It is therefore necessary to complete the updating operation of the peak polarity hold circuit 112 by the calculation and comparison operations for the input signal y(k) and the switching operation of the register selectors 107a and 107b, prior to the start of the calculation and comparison operations for the next input signal sampled value y(k). The operation speed (a minimum time interval between input signal sampled values y(k) to be decoded) of the decoder of this embodiment is limited by the time required for the input signal y(k) to be latched by the input latch 103 and then latched, if necessary, by the peak hold circuit 104 after the calculation and comparison operations and by the time required for the feedback of the hold signal 120 to the circuit 104. The operation speed of the decoder is also limited by the time required for updating the content of the peak polarity hold circuit 112 and completing the operation of the register selectors 107a and 107b in response to the fed-back select signal 108.

An example of decoding an input signal sampled value into a binary code sequence will be described with reference to FIGS. 3A1–3A5 and 3B1–3B5, the decoding operation being executed by using the signals from the peak hold signal generator 111a and peak polarity judgement circuit 111b, respectively output while executing the calculation and comparison operations.

Figure 5A:
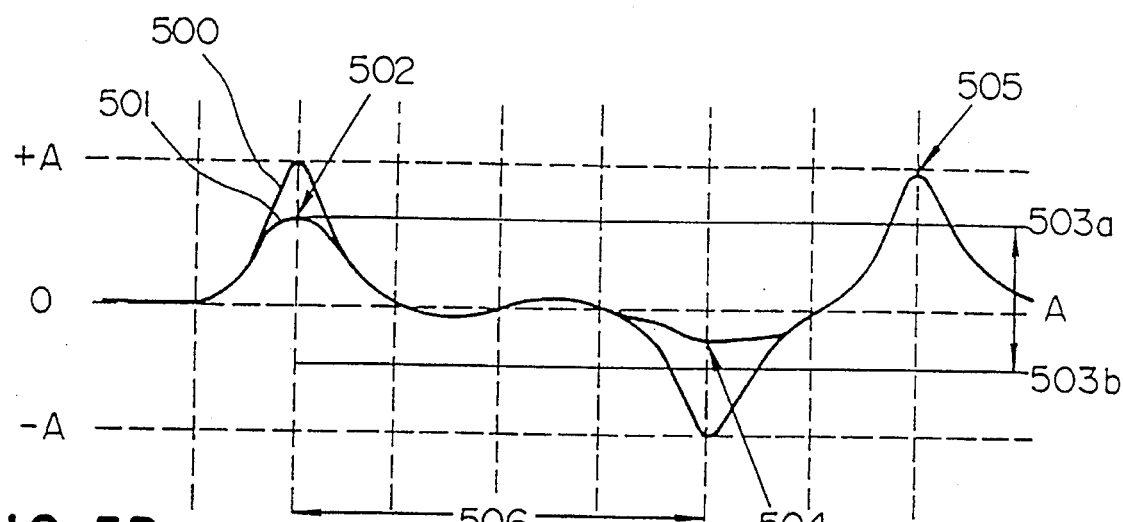
Figure 5B:
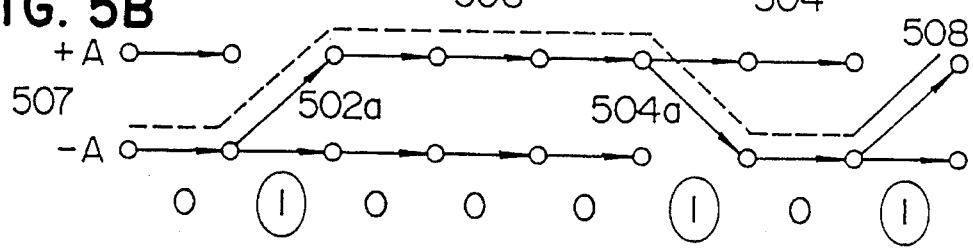
Figure 5C:
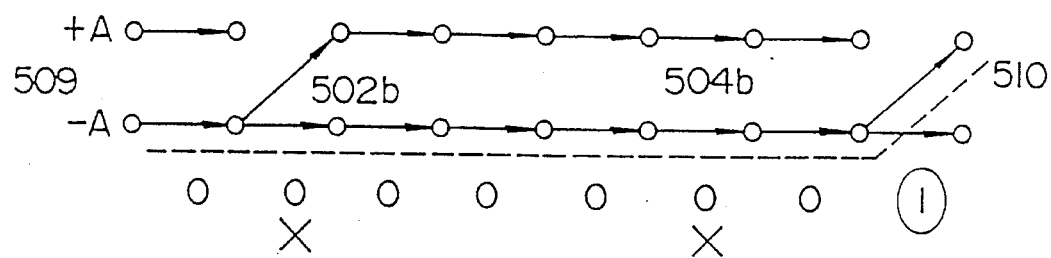

The signal y(k) input when the sub-clock signal is output from the peak hold signal generator 111a is a signal temporarily judged as the peak signal (corresponding to "1"). The time when this peak signal is judged as a true peak signal and the bit "1" or "0" is eventually determined, is the time when the next sub-clock signal is output from the peak hold signal generator 111a. For example, as shown in FIGS. 3A1–3A5, the temporarily judged peak signal 301 is assigned the bit "1" if the sub-clock signal 303 is output from the peak polarity judgement circuit 111b when the next sub-clock signal 302 is output from the peak hold signal generator 111a. In this case, the maximum likelihood sequence estimation provides the state transition diagram 304 and determines a selected path 306 for the most likely sequence.

If the sub-clock signal is not output from the peak polarity judgement circuit 111b when the sub-clock signal 302 is output from the peak hold signal generator 111a, as shown in FIGS. 3B1–3B5, the state transition diagram 307 is obtained and a select path 309 is determined, while assigning the temporarily judged peak signal 301 the bit "0". In this manner, each time the next peak signal is output from the peak hold signal generator 111a, it is judged whether the preceding peak signal output at the timing corresponding to when the sub-clock is generated by the peak hold signal generator 111a, is "1" or "0". As shown in FIGS. 3A1–3A5 and 3B1–3B5, the number of clocks 310 supplied to the decoder is counted to identify the serial number of a sampled signal input to the decoder as counted starting from the generation of the sub-clock from the peak hold signal generator 111a. The temporarily judged peak signal 301 is first assigned the bit "0" for the time being. If the sub-clock signal 303 is output as shown in FIGS. 3A1–3A5 from the peak polarity judgement circuit 111b when the next sub-clock signal 302 is output from the peak hold signal generator 111a, the bit position of the preceding peak signal 301 is identified from the number of clock pulses 310, and the first assigned bit "0" is changed to the bit "1" which is set as the final decoded result at the identified bit position. If, as shown in FIGS. 3B1–3B5, the sub-clock signal 303 is not output from the peak polarity judgment circuit 111b, the first assigned bit "0" is not changed but set as the final decoded result at the bit position. In response to the sub-clock signal 302 output from the peak hold signal generator 111a, counting the number of clocks 101 again starts for the decoding of the next polarity peak. The sampled signal for which the sub-clock signal 302 is not output from the peak hold signal generator 111a is immediately assigned as the decode result the bit "0". Since the final judgment is made after several sampled bits, in the fundamental embodiment shown in FIG. 1, there is provided a counter 113 so that the number of sampled bits after the preceding peak signal can be counted.

Specifically, the counter 113 is reset by the sub-clock from the peak hold signal generator 111a, and thereafter starts counting clocks 101. It is therefore possible upon reference to the count of the counter 113 to know the number of sampled bits after the detection of the latest peak signal presently stored in the peak hold circuit 104. For the decoding operation using the count information, there is provided a shift register 115 with "0" being set for a sufficiently long bit length. The contents of the shift register 115 are shifted synchronously with the clock 101, and the bit "1" is written at the bit position indicated by the count of the counter 113 when the sub-clock is output from the peak polarity judgement circuit 111b. To this end, there is provided a decoder 114 for decoding the count of the counter 113 into a bit position signal. When a write signal 118 or sub-clock is output from the peak polarity judgement circuit 111b, the bit "1" is written in the shift register 115 at the bit position indicated by the bit position signal from the decoder 114. This operation is conducted when the temporarily judged peak signal is finally determined as the bit "1". If the bit "0" is determined, no bit is written to the shift register 115. The flow bits output from the shift register 115 are determined as a final decoded result 127.

The characteristic feature of the present invention resides in that an input code sequence to a communications channel or recording/reproducing channel modulated by using a modulation scheme satisfying the run length limit is used as the input signal sampled values y(k) to each decoder. In a communications channel or recording/reproducing channel, synchronizing signals and timings used for data transfer are extracted from signals received at the output of the channel. From this reason, a run length limited code is used in forming a channel input code sequence so as not to generate an unlimited continuation of non-signal state "0" of the sampled values y(k) and so as to always maintain the consecutive "0" run length equal to or smaller than the predetermined maximum code length. If codes are used which limit the consecutive "0" run length of the input signal sampled values to the decoder shorter than the maximum m-code length, at least one sampled value among (m+1) input signal sampled values is the peak signal corresponding to the bit "1". As a result, in the embodiment shown in FIG. 1, the number of sampled bits is suppressed to be equal to or smaller than (m+1) bits, during the cycle time from when the temporarily judged peak is detected and held in the peak hold circuit 104 with the counter 113 being reset, and to when the next temporarily judged peak is detected with the counter 113 being reset and the preceding temporary peak is finally judged. Upon completion of the final judgement of the temporary peak, decoding the preceding input signal sampled values has already been completed. It is therefore no longer necessary to store the decoded results for the preceding input signal sampled values, in the shift register 115, and so the decoded results 127 is output immediately at that timing. In this manner, according to the present invention, the minimum bit length of the shift register 115 can be determined from the maximum "0" run length k bits of the run length limited code to be used. Therefore, by using the shift register 115 having a bit length equal to or longer than (k+1) bits, it is possible to provide a Viterbi decoder ensuring reliable decoding. The capability of definitely limiting the bit length of the shift register 115 of the decoder allows the delay time between the input of sampled values to the decoder to the final decoding, to be constantly maintained. In addition, the feedback operation time for the correction of the gain of an amplifier at the front stage of the decoder and for the correction of sampling timings, can be minimized and held constant. In the fundamental embodiment shown in FIG. 1, input signal sampled values are generated from output signals of a channel belonging to Partial Response Class IV.. The present invention is also applicable to output signals from a channel belonging to other Classes. For example, to output signals from a channel belonging to Partial Response Class I described with a polynomial 1+D(1), the invention becomes readily applicable by inverting the bits "0" and "1" written in the shift register 115 and interchanging the registers 106a and 106b. This case is applicable also to the embodiments to follow.

(2nd Embodiment)

Figure 4:
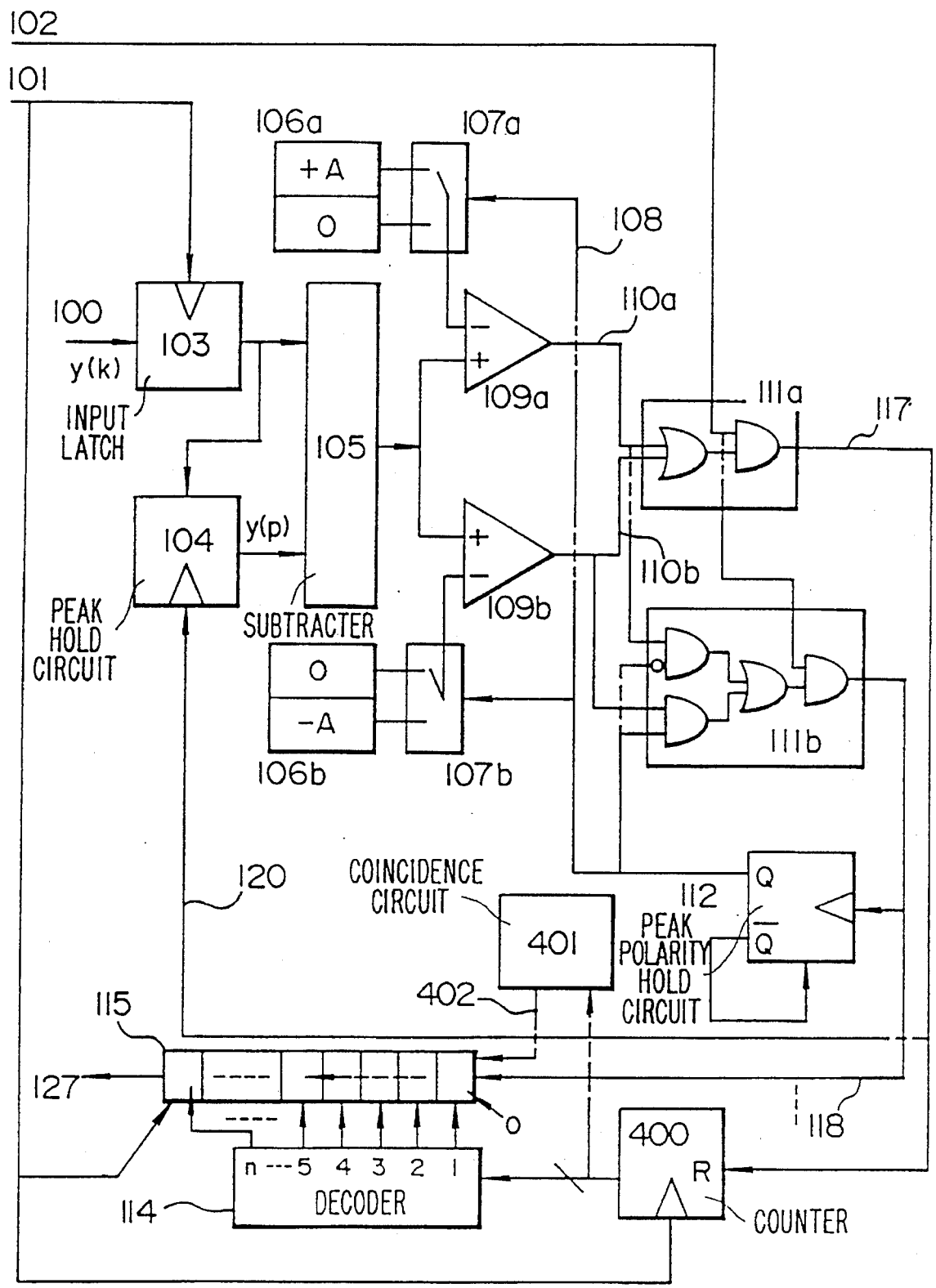
FIG. 4 is a block diagram showing another embodiment of the present invention.

As compared with the first embodiment shown in FIG. 1, the second embodiment shown in FIG. 4 has an additional function of reducing the number of errors and improving a decoding error rate, by incorporating the run length limited code.

To explain this function, a particular example of error generation in a Viterbi decoder is shown in FIG. 5 in which a signal 500 to be reproduced is detected as a distorted signal 501 because of a relatively large signal defect such as drop-out and noises. It is assumed in this embodiment that a code sequence supplied to the decoder has the maximum "0" run length of 3 bits.

In this embodiment, when a sampled peak signal is held in the decoder and temporarily judged as a positive polarity pulse peak, two slice levels including an upper limit slice level 503a and lower limit slice level 503b having a level difference A (an absolute value of a normal peak signal amplitude) are used, similarly to the embodiment decoder shown in FIG. 1. In the succeeding judgement, for the sampled signal level over the upper limit slice level 503a, a new positive polarity peak pulse is temporarily judged, and for the sampled signal level under the lower limit slice level 503b, a new negative polarity peak pulse is temporarily judged. For the intermediate sampled signal level between the two levels, it is judged as no pulse peak.

In the example shown in FIG. 5, if the incoming sampled signal with an extremely small defect follows the sampled peak signal 502, the normal state transition diagram 507 used for the maximum likelihood sequence estimation selects a branch 502a for the sampled peak signal 502, and a branch 504a for the sampled peak signal 504. As a result, the maximum likelihood sequence 508 corresponding to the correct decoded result is determined. In this case, even if the sampled peak signal 502 has a relatively large signal defect, the correct decoding before and after this signal can be ensured. On the other hand, as in the case of the distorted signal 501 having a signal defect at both the consecutive two sampled peak signals 502 and 504, the levels of both the sampled peak signals 502 and 504 are lowered. As a result, as shown in the estimating state transition diagram 509, the erroneous branch 504b is selected for the sampled peak signal 504. This erroneous selection influences the estimation of the temporarily judged preceding sampled peak signal 502 corresponding to the branch 502b, generating 2-bit errors for the sampled peaks 502 and 504 of the finally determined maximum likelihood sequence 508.

As described above, although the decoder of the fundamental embodiment shown in FIG. 1 can reduce a decoding error rate through maximum likelihood sequence estimation, it cannot effectively deal with a continuous lowered signal amplitude level (continuous no signal state) caused by continuous signal defects, and may sometimes have decoding errors not only of defective signals but also of generally normal signals which have less defects before and after defective signals. The second embodiment shown in FIG. 4 aims at providing a decoding method and a decoder capable of effectively preventing decoding errors by suppressing such error propagation as much as possible.

To this end, a run length limit is applied to a signal code sequence to be input to the decoder. Referring to FIG. 5, if the decoder does not hold a sampled peak (over the upper slice level limit 503a or under the lower slice level limit 503b), during the maximum "0" run length of 3 bits+1 bit (run length range 506) after it held the sampled peak 502, it is judged that a new sampled peak which might otherwise be judged temporarily and held in the decoder, was not detected because of the lowered signal level caused by defects, and that an abnormal state of the signal has occurred.

In operation of the decoder shown in FIG. 4, the temporarily judged sampled peak 502 is assigned as the decoded result the bit "1". If the temporarily judged sampled peak 502 cannot be settled definitely even after exceeding the run length range 506, this peak is a signal having the maximum level within the range 506. In addition, the sampled peak 502 is most probably a positive pulse peak when considering the sampled value before this pulse peak. From these two points and the run length limit allowing at least one positive polarity peak to occur within the run length range 506, it is appropriate to assign the sampled peak 502 the decoded result "1" as described above, thereby reducing the decoding error rate.

The sampled peak 502 temporarily judged as a negative polarity peak, is also assigned the decoded result "1", from the same reason described above. In this manner, two bit errors in the ordinary Viterbi decoding can be reduced to one bit error. In the embodiment shown in FIG. 4, the above-described function is added to the fundamental embodiment shown in FIG. 1. Specifically, assuming that the maximum "0" run length of the run length limited code sequence is k bits, a counter 400 counts from 0 to at least (k+2) bits. If the counter 400 counts up to (k+2) bits, it means that a lowered signal level has occurred. In this case, a coincidence between the count output from the counter 400 and the count (k+2) is checked by a coincidence circuit 401. If the count is (K+2), the coincidence circuit 401 outputs a forced write signal 402 to the shift register 115. Instead of using the coincidence circuit 401, an output of the decoder 114 at the (k+2)-th bit may be used as the forced write signal 402. In this case, it is necessary to adjust timing so that the output from the decoder 114 is input to the shift register after the output has been settled in the decoder 114. To realize the decoder having the above-described function, the bit length of the shift register 115 is required to be (k+2) one bit longer than the fundamental embodiment shown in FIG. 1. The decoder having the above-described function can most reliably stop the decoding error propagation to the sampled signal values before the lowered level signal.

(3rd Embodiment)

A continuous lowered signal level as discussed with the embodiment shown in FIG. 4 occurs frequently on an output signal from a recording/reproducing channel, because of a variety of defects on a recording medium. The period and degree of such a lowered-signal level become great as the recording density increases. Also in a communications channel, the influences by various defects on communications paths continue for a longer time period as the data transfer speed increases. If a received bit sequence has a longer no-signal state period, the Viterbi decoder using maximum likelihood sequence estimation does not operate efficiently and rather deteriorates the decoding error rate, although it effectively deals with write random noises. Therefore, the Viterbi decoding results during such a no-signal state period are very unreliable and cannot be used in practice.

Figure 6:
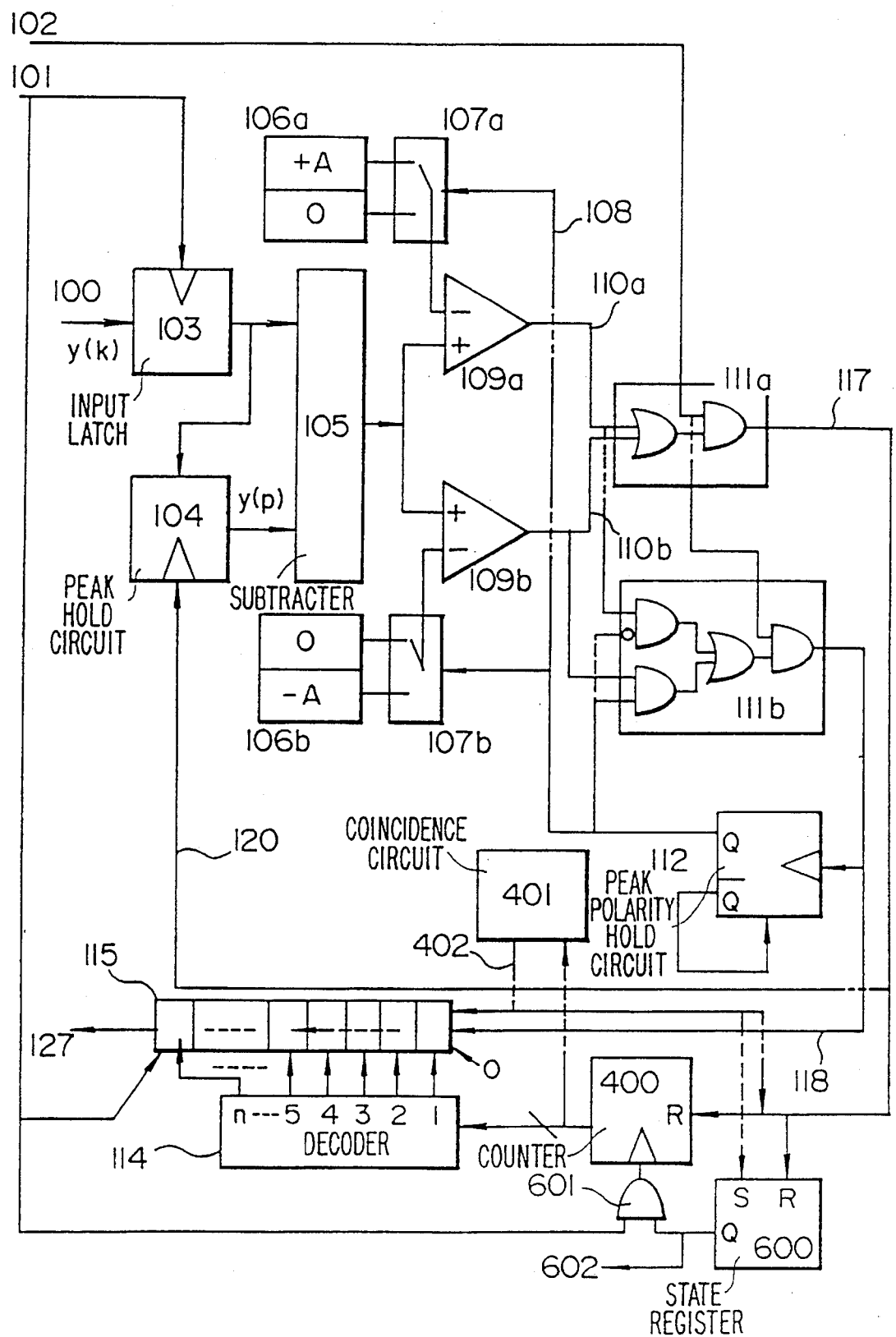
FIG. 6 is a block diagram showing a further embodiment of the present invention.

In an embodiment shown in FIG. 6, the no-signal state of input signal sampled values is detected, and the sampled values are assigned the bit "0", thereby providing a function of preventing a Viterbi decoder from following the abnormal signal state. The forced write signal 402 is a signal indicating a detection of the abnormal signal state as described with the embodiment shown in FIG. 4. This forced write signal 402 resets the counter 400 and sets a state register 600 to inform the decoder of the abnormal state. A gate 601 refers to an output of the state register 600, and stops supplying clocks 101 to the counter 400 during the set state of the state register 600.

The state register 600 is reset by the reset signal 117. In this way, the counter 400 is stopped until a sampled peak is normally detected. It is therefore possible to minimize the count range of the counter 400 to the range from 0 to (k+2) bits. The output of the decoder 114 is maintained "0" during the abnormal state, and the normal function of the Viterbi decoder starts again after the normal signal state is recovered and the reset signal 117 and write signal 118 are output. Instead of using the gate 601, the set output of the state register 600 may be used to turn off all outputs of the decoder 114.

In the embodiment shown in FIG. 6, the bit "0" is output as the decoded results of the input signal sampled values, during the abnormal state period and while the state register 600 is set. It is possible to output an error alarm signal 602 using an output of the state register 600, as well as the decoded result. If data to be decoded is image data, the image data quality can be prevented from degrading by executing an interpolation process using image data before and after the decoded result data given the alarm signal 602. Under the condition while the alarm signal is issued, there is a high possibility of presence of a single error of judging the bit "1" as bit "0" because of the lowered signal level. Therefore, by taking into account such a single error and identifying the bit position of the error with reference to the alarm signal 602, it is possible to improve the decoding error correction ability by using the error correction code, thereby improving the reliability of decoded data. Ideally, the alarm signal 602 should be issued when the lowered level signal starts being input. As a countermeasure for such a function, the decoded results 127 are delayed by k bits, and the alarm signal 602 is made to continue for k bits after setting the state register 600.

The above-described embodiments provide a sufficient means necessary for Viterbi decoding capable of dealing with an input signal abnormal state (lowered signal level state) of an optional time duration, while maximizing the advantages of the invention using a compact circuit of proper scale.

(4th Embodiment)

Figure 7:
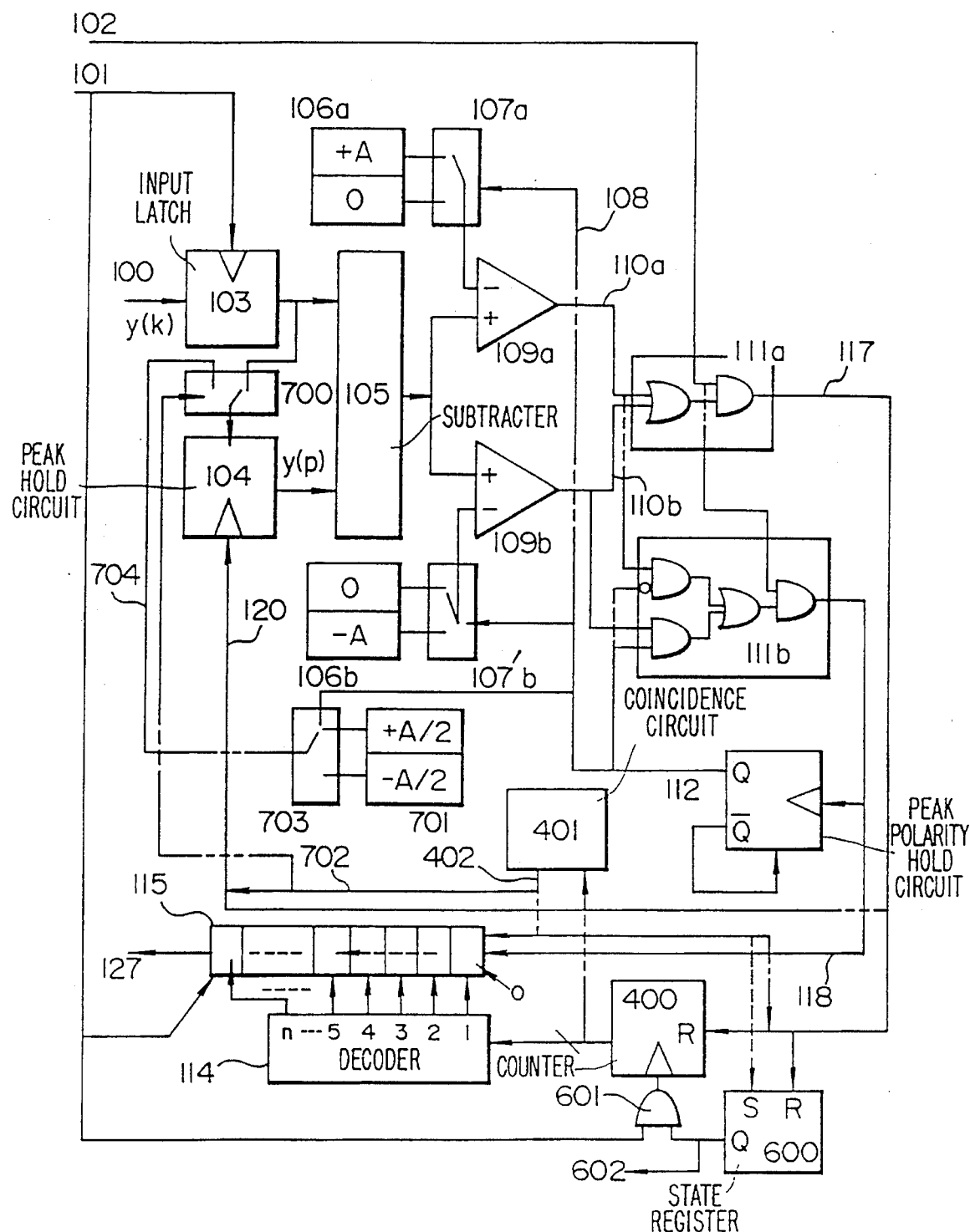
FIG. 7 is a block diagram showing a still further embodiment of the present invention.

An embodiment shown in FIG. 7 provides a means for dealing with an input signal abnormal state (continuous lowered signal level state) and recovering the normal state as fast and proper as possible without leaving the influence of the abnormal state upon the decoder. The maximum likelihood sequence decoding obtains a decoded bit sequence most likely to occur when time sequentially observing the input bit sequence. Therefore, if signal sequence information is once intercepted by continuous lowered signal level (two bits or more in the case of Partial Response Class IV), it is meaningless to store the signal information before the interception and use the information in estimating the signal sequence after the interception. In the embodiment shown in FIG. 6, after the Viterbi decoder detects the input signal abnormal state, the operation of the decoder is suspended by stopping the counter 400 itself or its partial function, to thereby minimize the influence of the abnormal state upon the decoder. In this embodiment shown in FIG. 7, there is provided a means for detecting an input signal abnormal state and clearing the contents stored in the Viterbi decoder. Information regarding a bit sequence stored in the decoder upon occurrence of the input signal abnormal state cannot be used after the recovery of the normal state. The information regarding a bit sequence in the embodiment shown in FIG. 6 includes the contents stored in the peak hold circuit 104 and peak polarity hold circuit 112, this information being the metrics of the observed two sequences, from the fundamental view point of maximum likelihood sequence estimation. The reliability of these two metrics as the estimation evaluation criterion for maximum likelihood sequence estimation is considerably degraded if continuous signal sequence defects occur. In the case of the sequence interception, the decoding reliability can be improved by initializing the metrics and starting again the estimation rather than by proceeding the estimation using the lower reliability metrics. For example, in the embodiment shown in FIG. 6, when the sampled signal 501 shown in FIG. 5 is input, a positive polarity peak of low reliability with large distortion and signal defects is stored in the peak hold circuit 104 after the signal interception. Such large distortion and signal defects are one reason of the abnormally-detected signal. The actually received bit sequence gradually lowers its level before and after the sampled peak. Continuing to hold this sampled peak up to the start of decoding after the interception, is not advantageous therefore, even from the probability view point. Since the decoder which has recovered the normal state after the interception can be considered as having the same environment as the decoding start, signal sequence information before the interception is not necessary. Whether the positive polarity pulse occurs first or the negative polarity pulse occurs first has the same probability. It is therefore desirable to set the upper threshold level limit (503a in FIG. 5) and lower threshold level limit (503b in FIG. 5) of the comparator 109a and 109b to +A/2 and −A/2, respectively. This is equivalent to setting zero as the metrics of (or metric difference between) two sequences for the maximum likelihood sequence estimation. Namely, it is equivalent to providing slice level detectors only for the first detection after the start of decoding, thereby quickly recovering the normal state of the decoder.

A means for realizing such a function is provided in the embodiment shown in FIG. 7. In this embodiment, when detecting the abnormal state, a hold signal 702 as the forced write signal 402 is output to a selector 700 to make the peak hold circuit 104 hold a value in a hold value renewal register 701. The hold value renewal register 701 holds two values one of which is selected by a register selector circuit 703 in response to an output of the peak polarity hold circuit 112. When the peak polarity hold circuit 112 outputs the signal representative of the positive polarity, the register selector circuit 703 selects a value +A/2, and when the circuit 112 outputs the signal representative of the negative polarity, the register selector circuit 703 selects a value −A/2. For both the cases, the contents of peak hold circuit 104 are renewed so that the upper threshold level limit (503a in FIG. 5) and lower threshold level limit (503b in FIG. 5), respectively of the comparators 109a and 109b, are set to +A/2 and −A/2 (A is an absolute value of the normal peak value), respectively. As an alternative means realizing such a function, the hold renewal value register 701 may hold one value +A/2 or −A/2, and a means is provided which forcibly sets the output state of the peak polarity hold circuit 112 either to the positive or negative polarity output state, by using the forced write signal 402. In this case, the register selector circuit 703 is not necessary. This state setting is effective for the initial state setting of the decoder for the re-start of decoding. This initial state setting can be achieved by resetting the counter 400 and supplying the forced write signal 402 to the peak polarity hold circuit 112. With such initial state setting, quasi input data before the data to be decoded is not necessary. If such initial state setting is not performed, quasi input data of two or more pulses at the minimum is required, or otherwise several bits after the start of decoding become error bits. This embodiment is free from such restrictions.

For a magnetic recording/reproducing channel, particularly for a reproducing channel of a magnetic disk apparatus, there is known a method (defective area memory function) in which it is checked in advance whether there is a defective area of a recording medium the output level of reproduced signals from which lowers continuously below a predetermined level, to thereby prevent recording/reproducing data in the defective area indicated by the stored address thereof. If the maximum likelihood sequence decoder is applied to such an apparatus, the defective area can be logically neglected. However, input of signals from the defective area to the decoder continues physically. The decoder is therefore essentially required to provide a function of not tracking the input signals and a function of starting decoding immediately after the defective area. According to the just-described embodiment, this function can be easily obtained in the following manner. While the defective area is read, this reading operation can be readily detected by the apparatus. While receiving this detection signal on the decoder side, sending the forced write signal 402 and resetting the counter 400 are continued until the defective area becomes undetectable. Thereafter, the decoder is set immediately before reading signals from the normal area. The present invention provides a means for allowing the Viterbi (maximum likelihood sequence) decoder to be applied to apparatuses having such a defective area memory function.

(5th Embodiment)

Figure 10:
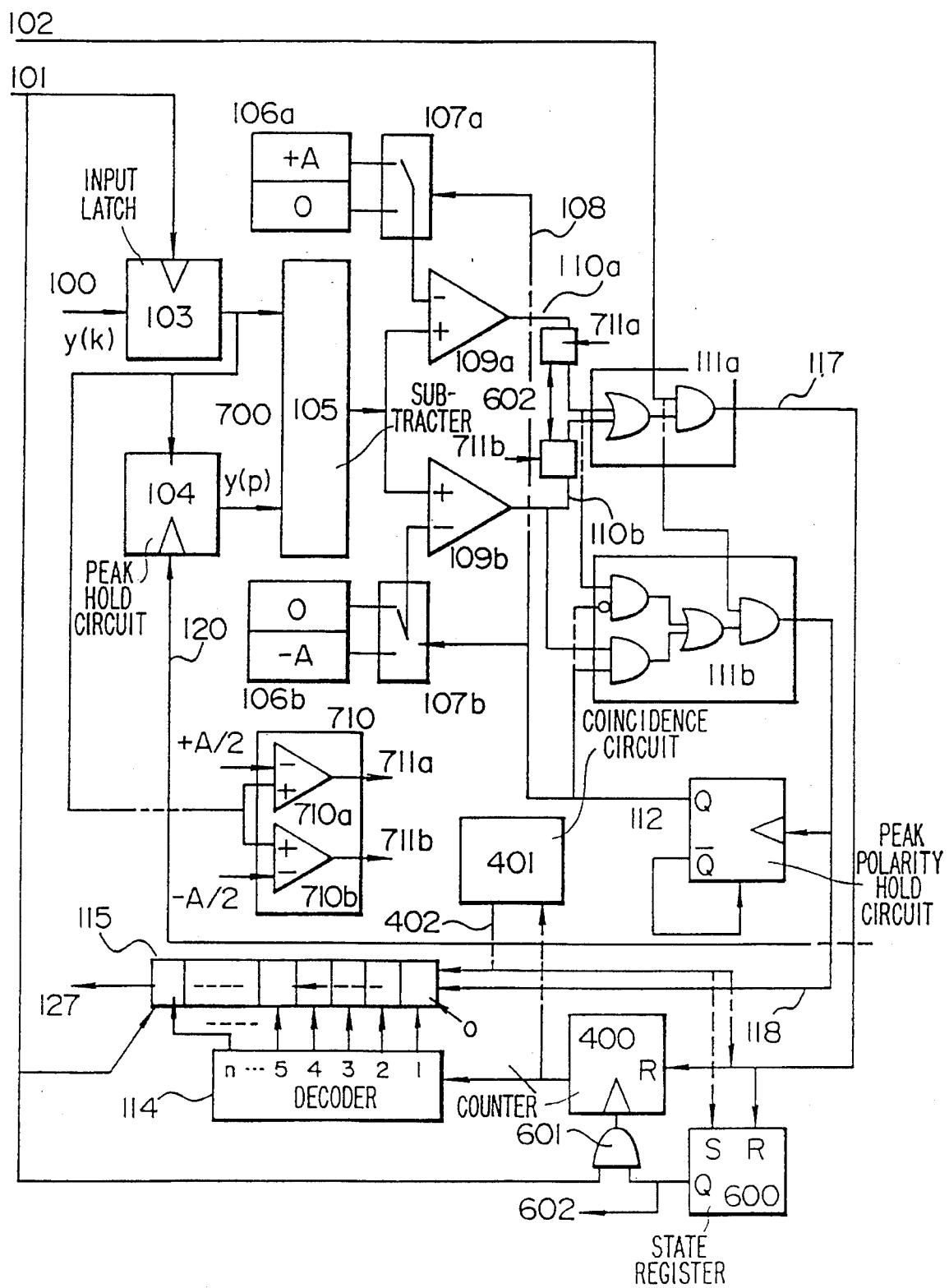
FIG. 10 is a block diagram showing another embodiment of the present invention.

FIG. 10 shows another embodiment having the same function as the embodiment shown in FIG. 7. In this embodiment, additional comparators 710 having fixed slice levels are provided to detect the first signal after the recovery of the normal state. Specifically, an output of the input latch 103 is supplied to the two comparators 710a and 710b. The comparator 710a delivers an output of an on-state when the input level is larger than the fixed slice level +A/2, namely the on-state output indicates a detection of the positive polarity pulse on the input signal. The comparator 710b delivers an output of an on-state when the input level is smaller than the fixed slice level −A/2, namely the on-state output indicates detection of the negative polarity pulse on the input signal. When the alarm signal 602 indicates the abnormal state, selectors select the comparator outputs 711a and 711b instead of the outputs 110a and 110b from the comparators 109a and 109b, and supplies them to the peak hold signal generator 111a and peak polarity judgement circuit 111b. When the alarm signal 602 indicates the normal state, the outputs 110a and 110b are supplied to the peak hold signal generator 111a and peak polarity judgment circuit 111b. As above, in this embodiment, the additional comparators and selectors are provided to the Viterbi decoder to use them during the abnormal state.

(6th Embodiment)

Figure 8:
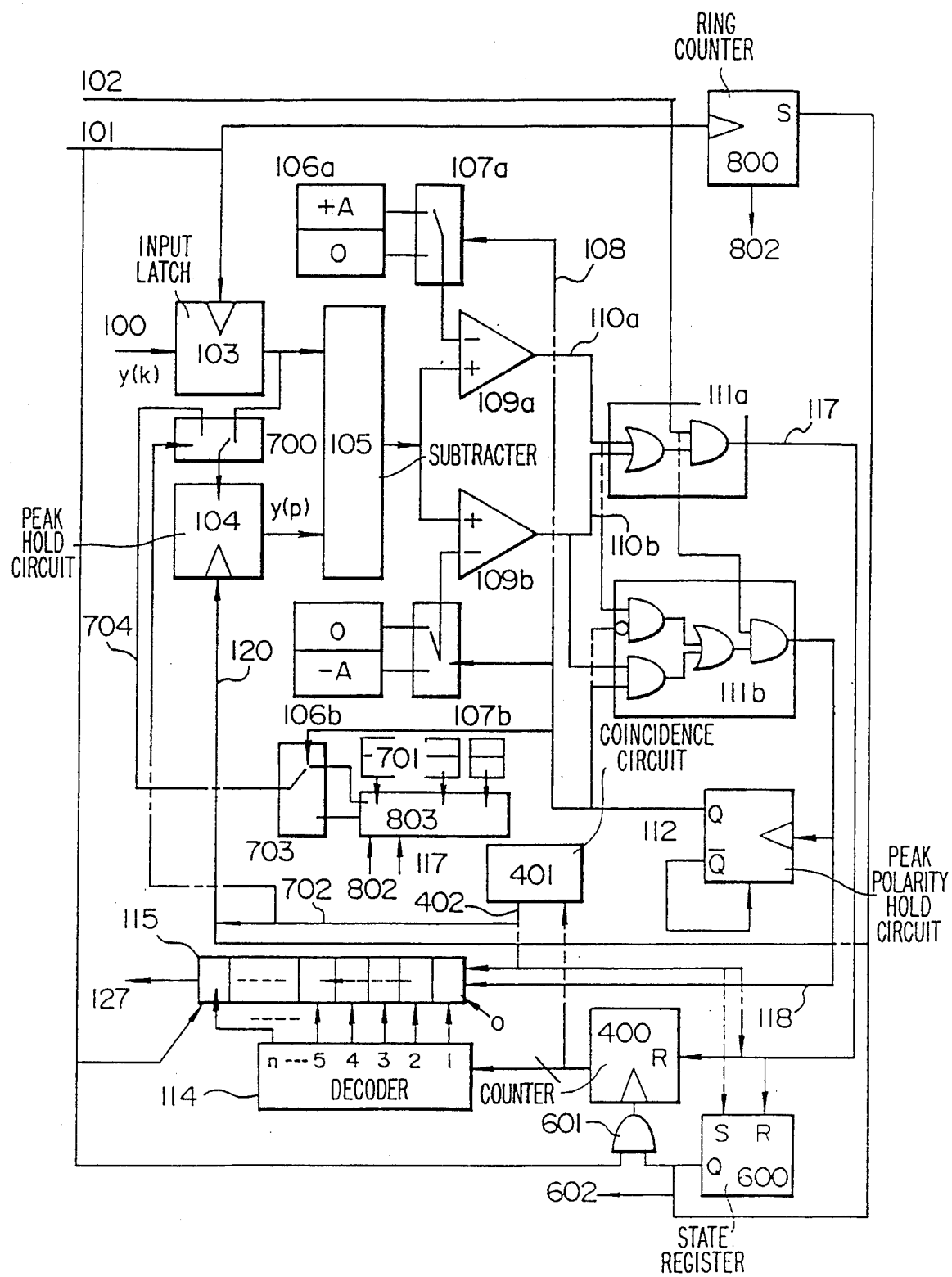
FIG. 8 is a block diagram showing another embodiment of the present invention.

FIG. 8 shows another embodiment in which the normal state can be recovered quickly by providing a means for detecting the gradual increase of the signal amplitude at an earlier stage. While the state register 600 indicates the abnormal state, a predetermined number of bits of an incoming signal is counted by a ring counter 800. Each time the ring counter 800 is reset to "0", a select signal 802 is output therefrom to a selector 803 to sequentially select one of a plurality of hold renewal level registers 701 each storing a value obtained by stepwise dividing the value A to an allowable degree. The sequential selection continues until the reset signal 117 is generated when the hold renewal level registers 701 are switched to the registers 106a and 106b. In this way, it is possible to detect the gradual increase of the signal amplitude at an earlier stage, recovering the normal state of the decoder quickly. The select signal 802 may be used as a signal for controlling the amplifier at the preceding stage of the decoder to stepwise increase the gain of the amplifier and amplify the portion of the attenuated signal level.

As appreciated from the foregoing description of the present invention, there is provided a decoding method and apparatus capable of decoding an output of a Partial Response channel into the maximum likelihood code sequence at high speed and with simplified structure by using a Viterbi algorithm. Furthermore, the decoding method and apparatus of the present invention allows the decoding by the decoder to reliably follow a normal incoming bit sequence without decoding an abnormal incoming bit sequence from a channel, the abnormal incoming bit sequence being caused by continuous signal defects and greatly deteriorating the decoding quality.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A magnetic recording/reproducing apparatus comprising:

a magnetic recording medium recording a binary signal;

a magnetic head for detecting said binary signal from said magnetic recording medium;

an amplifier for amplifying said binary signal detected by said magnetic head;

a channel for outputting said detected binary signal amplified by said amplifier in the form of a timing value sequence, said timing value sequence alternately providing positive and negative peak values following the rule of said binary signal recorded in said recording medium;

temporary judging means for judging a presently input timing value of said timing value sequence supplied from said channel as one of said positive peak value, said negative peak value, and an intermediate value, in accordance with the relationship with a preceding timing value temporarily judged as one of said positive and negative peak values; and final judging means for finally setting said preceding timing value temporarily judged as one of said positive and negative peak values, as one of said positive and negative peak values and said intermediate value, in accordance with the relationship with said presently input and temporarily judged timing value.

2. A magnetic recording/reproducing apparatus according to claim 1, further comprising a demultiplexer for distributing said binary signal from said amplifier to a plurality of channels.

3. A magnetic recording/reproducing apparatus according to claim 1, wherein said temporary judging means temporarily judges said presently input timing value of said timing value sequence as one of said positive peak value, said negative peak value, and said intermediate value, in accordance with the relationship with the amplitude of a preceding timing value temporarily judged as being one of said positive and negative peak values.

4. A magnetic recording/reproducing apparatus according to claim 3, wherein said temporary judging means includes an input latch for latching said presently input timing value, a peak hold circuit for holding said preceding timing value temporarily judged as one of said positive and negative peak values, and comparator means for comparing an output of said input latch with an output of said peak hold circuit.

5. A magnetic recording/reproducing apparatus according to claim 4, wherein said comparator means includes a first subtracter for subtracting an output of said peak hold circuit from an output of said input latch, and a second subtracter for subtracting a predetermined value from an output of said first subtracter.

6. A magnetic recording/reproducing apparatus according to claim 1, wherein said final judging means judges said preceding timing value temporarily judged as one of said positive and negative peak values, as one of said positive and negative peak values and said intermediate value, in accordance with the relationship with the polarity of said presently input and temporarily judged timing value.

7. A magnetic recording/reproducing apparatus according to claim 6, wherein said final judging means finally determines said preceding timing value temporarily judged as one of said positive and negative peak values, in accordance with the following rules:

(1) determining as said positive peak value if said preceding timing value temporarily judged is said positive peak value and said presently input and temporarily judged timing value is said negative peak value;

(2) determining as said negative peak value if said preceding timing value temporarily judged is said negative peak value and said presently input and temporarily judged timing value is said positive peak value; and (3) determining as said intermediate value if said preceding timing value temporarily judged has the same polarity as that of said presently input and temporarily judged timing value.

8. A magnetic recording/reproducing apparatus according to claim 7, wherein said final judging means includes a polarity hold circuit for holding the polarity of said preceding timing value temporarily judged as one of said positive and negative peak values, and a peak polarity judging circuit for judging whether there is a change in the polarity of said preceding timing value temporarily judged as one of said positive and negative peak values.

9. A magnetic recording/reproducing apparatus according to claim 7, wherein said final judging means includes a counter for counting the number of input bits of said timing value sequence, means for resetting said counter when said preceding timing value temporarily judged as one of said positive and negative peak values is output, a register for storing a judgement result of said final judging means as a decoded binary bit value, and means for overwriting the bit value in said register at the bit position corresponding to the count of said counter.

10. A magnetic recording/reproducing apparatus comprising:

a magnetic recording medium for recording a binary signal;

a magnetic head for detecting said binary signal from said magnetic recording medium;

an amplifier for amplifying said binary signal detected by said magnetic head;

a channel for outputting said detected binary signal amplified by said amplifier in the form of a timing value sequence, said timing value sequence alternately providing positive and negative peak values following the rule of said binary signal recorded in said recording medium;

temporary judging means for judging a presently input timing value of said timing value sequence supplied from said channel as one of said positive peak value, said negative peak value, and an intermediate value, in accordance with the relationship with a preceding timing value temporarily judged as one of said positive and negative peak values;

final judging means for finally setting said preceding timing value temporarily judged as one of said positive and negative peak values, as one of said positive and negative peak values and said intermediate value, in accordance with the relationship with said presently input and temporarily judged timing value;

a counter for counting the number of input bits of said timing value sequence;

means for resetting said counter when said timing value temporarily judged as one of said positive and negative peak values is output;

a register for storing a judgement result of said final judging means as a decoded binary bit value; and means for overwriting the bit value in said register at the bit position corresponding to the count of said counter.

11. A magnetic recording/reproducing apparatus comprising:

a magnetic recording medium recording a binary signal;

a magnetic head for detecting said binary signal from said magnetic recording medium;

an amplifier for amplifying said binary signal detected by said magnetic head;

a channel for outputting said detected binary signal amplified by said amplifier in the form of a timing value sequence, said timing value sequence alternately providing positive and negative peak values following the rule of said binary signal recorded in said recording medium, said binary signal having a decoded run length limit of the maximum bit length k;

judging means for judging a presently input timing value of said timing value sequence supplied from said channel as one of said positive peak value, said negative peak value, and an intermediate value, in accordance with the relationship with a preceding timing value judged as one of said positive and negative peak values;

a counter for counting the number of input bits of said presently inputted timing value sequence;

means for resetting said counter when said preceding timing value judged as one of said positive and negative peak values is outputted;

a register for storing a judgement result of said judging means as a decoded binary bit value as a bit sequence having information of (k+n) bits or more of said timing value sequence, wherein n is a natural number of 1 or more; and means for overwriting the bit value in said register at the bit position corresponding to the count of said counter and outputting said bit value which has been overwritten.

12. The magnetic recording/reproducing apparatus according to claim 11, wherein said judging means comprises:

temporary judging means for judging a presently input timing value of said timing value sequence supplied from said channel as one of said positive peak value, said negative peak value, and an intermediate value, in accordance with the relationship with a preceding timing value temporarily judged as one of said positive and negative peak values;

final judging means for finally setting said preceding timing value temporarily judged as one of said positive and negative peak values, as one of said positive and negative peak values and said intermediate value, in accordance with the relationship with said presently input and temporarily judged timing value.

13. The magnetic recording/reproducing apparatus according to claim 12, wherein said counter counts the number of (k+n) bits or more of said timing value sequence, and further comprising means for generating a coincidence signal when the count of bits of said timing value sequence coincides with a predetermined value of (k+n) bits or more, and in response to said coincidence signal, changing the content of said register at the position corresponding to said count.

14. The magnetic recording/reproducing apparatus according to claim 13, further comprising a state register for storing a normal/abnormal state of said timing value sequence, wherein an abnormal state is recorded in said state register in response to an output of said coincidence signal, and a normal state is stored in said state register in response to an output of said temporarily judged signal.

15. The magnetic recording/reproducing apparatus according to claim 13, further comprising a state register for storing a normal/abnormal state of said timing value sequence, means for recording an abnormal state in said state register in response to an output of said coincidence signal and recording a normal state in said state register in response to an output of said temporarily judged signal, and means for stopping the operation of said counter while the content of said state register indicates said abnormal state.

16. The magnetic recording/reproducing apparatus according to claim 13, further comprising a state register for storing a normal/abnormal state of said timing value sequence, means for recording an abnormal state in said state register in response to an output of said coincidence signal and recording a normal state in said state register in response to an output of said temporarily judged signal, and means for inhibiting to change the content of said state register at the bit position corresponding to the count of bits of said timing value sequence, while the content of said state register indicates said abnormal state.

17. The magnetic recording/reproducing decoding apparatus according to claim 13, further comprising means for initializing the count of said counter in response to an output of said coincidence signal.

18. The magnetic recording/reproducing apparatus according to claim 13, further comprising:

a state register for storing a normal/abnormal state of said timing value sequence, wherein an abnormal state is recorded in said state register in response to an output of said coincidence signal, and a normal state is stored in said state register in response to an output of said temporarily judged signal; and means for outputting said state recorded in said state register when a decoded result is output.

19. The magnetic recording/reproducing apparatus according to claim 13, further comprising means for detecting the succeeding bit having one of said maximum and minimum levels by using a comparator having a fixed comparison level, in response to an output of said coincidence signal.

20. The magnetic recording/reproducing apparatus according to claim 13, further comprising means for detecting the succeeding bit having one of said maximum and minimum levels by using a comparator having a fixed comparison level if said state in said state register indicates said abnormal state.

* * * * *